US012628395B2

(12) United States Patent
Wu et al.

(10) Patent No.: US 12,628,395 B2
(45) Date of Patent: May 12, 2026

(54) HEMT SEMICONDUCTOR DEVICE WITH A AlInGAN LAYER FOR POLARITY CONTROL

(71) Applicant: KABUSHIKI KAISHA TOSHIBA, Tokyo (JP)

(72) Inventors: Peitsen Wu, Kawasaki (JP); Shigeya Kimura, Yokohama (JP); Hisashi Yoshida, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 763 days.

(21) Appl. No.: 17/817,752

(22) Filed: Aug. 5, 2022

(65) Prior Publication Data

US 2023/0282708 A1 Sep. 7, 2023

(30) Foreign Application Priority Data

Mar. 2, 2022 (JP) ................................. 2022-031682

(51) Int. Cl.
*H10D 62/832* (2025.01)
*H10D 30/01* (2025.01)
(Continued)

(52) U.S. Cl.
CPC ....... *H10D 62/8325* (2025.01); *H10D 30/475* (2025.01); *H10D 62/8503* (2025.01); *H10D 30/015* (2025.01)

(58) Field of Classification Search
CPC .. H10D 64/518; H10D 62/12; H10D 62/8503; H10D 62/125; H10D 30/01; H10D 30/475
See application file for complete search history.

(56) References Cited

U.S. PATENT DOCUMENTS 9,054,170 B2 6/2015 Yamada
2001/0017370 A1* 8/2001 Sheppard ........... H10D 30/4755
257/E29.081

(Continued)

FOREIGN PATENT DOCUMENTS

JP 2002-16087 A 1/2002
JP 2005-244072 A 9/2005
(Continued)

OTHER PUBLICATIONS

Jian Tang, Xiaoliang Wang, Hongling Xiao, Junxue Ran, Cuimei Wang, Xiaoyan Wang, Guoxin Hu, Jinmin Li (2008), AlGaN/GaN/ InGaN/GaN DH-HEMTs structure with an AlN interlayer grown by MOCVD. Phys. Status Solidi (c), 5: 2982-2984. (Year: 2008).*
(Continued)

*Primary Examiner* — Davienne N Monbleau
*Assistant Examiner* — Heim Kirin Grewal
(74) *Attorney, Agent, or Firm* — Oblon, McClelland, Maier & Neustadt, L.L.P.

(57) ABSTRACT

According to one embodiment, a semiconductor device, includes first to third electrodes, first to third layers, and an insulating member. A position of the third electrode is between a position of the first electrode and a position of the second electrode. The first layer includes first to fifth partial regions. The fourth partial region is located between the first and third partial regions. The fifth partial region is located between the third and second partial regions. The second layer includes a first compound region provided between the third partial region and the third electrode. The third layer includes first to third portions. The third portion is located between the third partial region and the first compound region. The insulating member includes a first insulating region. The first insulating region is located between the first compound region and the third electrode.

15 Claims, 4 Drawing Sheets

(51) Int. Cl.
　　 H10D 30/47 　　　　(2025.01)
　　 H10D 62/85 　　　　(2025.01)

(56) References Cited

U.S. PATENT DOCUMENTS

| | | | | |
|---|---|---|---|---|
| 2011/0108885 A1* | 5/2011 | Sazawa | ................ | H10D 30/751 |
| | | | | 257/E21.119 |
| 2012/0049180 A1* | 3/2012 | Yamada | ............. | H10D 62/8503 |
| | | | | 257/500 |
| 2018/0197979 A1 | 7/2018 | Ozaki et al. | | |
| 2018/0308968 A1* | 10/2018 | Miura | ................... | H10D 62/85 |
| 2019/0267483 A1 | 8/2019 | Tanaka | | |

FOREIGN PATENT DOCUMENTS

| | | |
|---|---|---|
| JP | 2009-54623 A | 3/2009 |
| JP | 2009-124166 A | 6/2009 |
| JP | 2009-231396 A | 10/2009 |
| JP | 2012.54352 A | 3/2012 |
| JP | 2014-123665 A | 7/2014 |
| JP | 2017-85004 A | 5/2017 |
| JP | 2018-160668 A | 10/2018 |
| JP | 2018-182247 A | 11/2018 |

OTHER PUBLICATIONS

Shen, Z. et al. "Prediction of High-Density and High-Mobility Two-Dimensional Electron Gas at AlxGa1—xN/4H—SiC Interface" Materials Science Form vol. 897, (2017) 1 page.

Shimizu, M. et al. "GaN Power Device Team" AIST. https://unit. aist.go.jp/adperc/cie/teams/g-pdt_html (4 pages).

Office Action issued Feb. 3, 2025, in corresponding Japanese Patent Application No. 2022-031682 (with English Translation), 16 pages.

Japanese Office Action Issued Aug. 4, 2025 in Japanese Patent Application No. 2022-031682 (with unedited computer-generated English translation), 8 pages.

* cited by examiner

HEMT SEMICONDUCTOR DEVICE WITH A AlInGAN LAYER FOR POLARITY CONTROL

CROSS-REFERENCE TO RELATED APPLICATIONS

This application is based upon and claims the benefit of priority from Japanese Patent Application No. 2022-031682, filed on Mar. 2, 2022; the entire contents of which are incorporated herein by reference.

FIELD

Embodiments of the invention generally relate to a semiconductor device.

BACKGROUND

For example, there is a semiconductor device using SiC. Good characteristics are desired in semiconductor devices.

DETAILED DESCRIPTION

Figure 1:
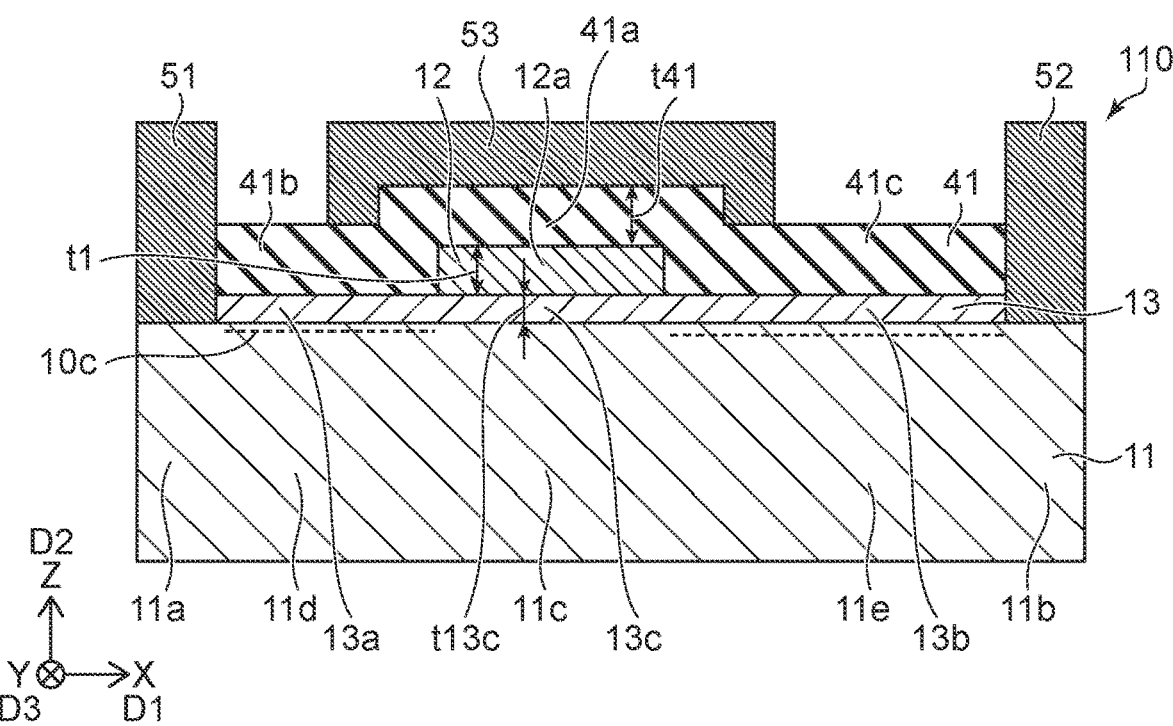
FIG. 1 is a schematic cross-sectional view illustrating a semiconductor device according to a first embodiment.

According to one embodiment, a semiconductor device, includes a first electrode, a second electrode, a third electrode, a first layer, a second layer, a third layer, and an insulating member. A position of the third electrode in a first direction from the first electrode to the second electrode is between a position of the first electrode in the first direction and a position of the second electrode in the first direction. The first layer includes SiC. The first layer includes a first partial region, a second partial region, a third partial region, a fourth partial region and a fifth partial region. A direction from the first partial region to the first electrode is along a second direction crossing the first direction. A direction from the second partial region to the second electrode is along the second direction. A direction from the third partial region to the third electrode is along the second direction. The fourth partial region is located between the first partial region and the third partial region in the first direction. The fifth partial region is located between the third partial region and the second partial region in the first direction. The second layer includes $Al_xIn_yGa_{1-x-y}N$ (x+y=1, 0≤x<1, 0≤y≤1). The second layer includes a first compound region provided between the third partial region and the third electrode. The third layer includes $Al_zGa_{1-z}N$ (x<z≤1). The third layer includes a first portion, a second portion, and a third portion. A direction from the fourth partial region to the first portion is along the second direction. A direction from the fifth partial region to the second portion is along the second direction. The third portion is located between the third partial region and the first compound region. The insulating member includes a first insulating region. The first insulating region is located between the first compound region and the third electrode. The second layer does not include a region overlapping the fourth partial region in the second direction, and does not include a region overlapping the fifth partial region in the second direction. Or the second layer includes a second compound region and a third compound region. A direction from the fourth partial region to the second compound region and a direction from the fifth partial region to the third compound region are along the second direction. A first thickness of the first compound region along the second direction is thicker than a second thickness of the second compound region along the second direction, and thicker than a third thickness of the third compound region along the second direction.

According to one embodiment, a semiconductor device includes a first electrode, a second electrode, a third electrode, a first layer, a second layer, a third layer, and an insulating member. A position of the third electrode in a first direction from the first electrode to the second electrode is between a position of the first electrode in the first direction and a position of the second electrode in the first direction. The first layer includes SiC. The first layer includes a first partial region, a second partial region, a third partial region, a fourth partial region and a fifth partial region. A direction from the first partial region to the first electrode is along a second direction crossing the first direction. A direction from the second partial region to the second electrode is along the second direction. A direction from the third partial region to the third electrode is along the second direction. The fourth partial region is located between the first partial region and the third partial region in the first direction. The fifth partial region is located between the third partial region and the second partial region in the first direction. The second layer includes at least one selected from the group consisting of zinc oxide, a first compound and a second compound. The second layer includes a first compound region provided between the third partial region and the third electrode. The first compound includes a group II element and a group VI element. The second compound includes a group III element and a group V element. The third layer includes $Al_zGa_{1-z}N$ (x<z≤1). The third layer includes a first portion, a second portion, and a third portion. A direction from the fourth partial region to the first portion is along the second direction. A direction from the fifth partial region to the second portion is along the second direction. The third portion is located between the third partial region and the first compound region. A lattice length in the third layer in a crossing direction crossing the second direction is shorter than a lattice length in the second layer along the crossing direction. The insulating member includes a first insulating region. The first insulating region is located between the first compound region and the third electrode. The second layer does not include a region overlapping the fourth partial region in the second direction, and does not include a region overlapping the fifth partial region in the second direction. Or the second layer includes a second compound region and a third compound region. A direction from the fourth partial region to the second compound region and a direction from the fifth partial region to the third compound region are along the second direction. A first thickness of the first compound region along the second direction is thicker than a second thickness of the second compound region along the second direction, and thicker than a third thickness of the third compound region along the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to the first embodiment.

As shown in FIG. 1, a semiconductor device 110 according to the embodiment includes a first electrode 51, a second electrode 52, a third electrode 53, a first layer 11, a second layer 12, a third layer 13, and an insulating member 41.

A first direction D1 from the first electrode 51 to the second electrode 52 is an X-axis direction. One direction perpendicular to the X-axis direction is defined as a Z-axis direction. The direction perpendicular to the X-axis direction and the Z-axis direction is defined as the Y-axis direction.

A position of the third electrode 53 in the first direction D1 is located between a position of the first electrode 51 in the first direction D1 and a position of the second electrode 52 in the first direction D1. These electrodes extend, for example, along the Y-axis direction (for example, a third direction D3).

The first layer 11 includes SiC. The first layer 11 may include, for example, a SiC substrate. The first layer 11 includes a first partial region 11a, a second partial region 11b, a third partial region 11c, a fourth partial region 11d, and a fifth partial region 11e. A direction from the first partial region 11a to the first electrode 51 is along a second direction D2. The second direction D2 crosses the first direction D1. The second direction D2 is, for example, the Z-axis direction.

A direction from the second partial region 11b to the second electrode 52 is along the second direction D2. A direction from the third partial region 11c to the third electrode 53 is along the second direction D2. At least a part of the first partial region 11a overlaps the first electrode 51 in the second direction D2. At least a part of the second partial region 11b overlaps the second electrode 52 in the second direction D2. At least a portion of the third partial region 11c overlaps the third electrode 53 in the second direction D2.

The fourth partial region 11d is located between the first partial region 11a and the third partial region 11c in the first direction D1. The fifth partial region 11e is located between the third partial region 11c and the second partial region 11b in the first direction D1. In the first to fifth partial regions 11a to 11e, the boundaries between them may be unclear.

The second layer 12 includes $Al_xIn_yGa_{1-x-y}N$ (x+y=1, 0≤x<1, 0≤y≤1). In one example, the second layer 12 includes AlGaN. In one example, the second layer 12 includes InGaN. In one example, the second layer 12 includes AlInGaN.

The second layer 12 includes a first compound region 12a. The first compound region 12a is provided between the third partial region 11c and the third electrode 53. As will be described later, the second layer 12 may further include other regions.

The third layer 13 includes $Al_zGa_{1-z}N$ (x<z≤1). In one example, the composition ratio z is 0.8 or more. For example, the third layer 13 includes AlN.

The third layer 13 includes a first portion 13a, a second portion 13b, and a third portion 13c. A direction from the fourth partial region 11d to the first portion 13a is along the second direction D2. A direction from the fifth partial region 11e to the second portion 13b is along the second direction D2. The third portion 13c is located between the third partial region 11c and the first compound region 12a.

The insulating member 41 includes a first insulating region 41a. The first insulating region 41a is located between the first compound region 12a and the third electrode 53.

The first electrode 51 is electrically connected to, for example, the first partial region 11a. The first electrode 51 may be electrically connected to, for example, the first portion 13a. The second electrode 52 is electrically connected to, for example, the second partial region 11b. The second electrode 52 may be electrically connected to, for example, the second portion 13b.

A current flowing between the first electrode 51 and the second electrode 52 can be controlled by a potential of the third electrode 53. The potential of the third electrode 53 may be, for example, a potential based on the potential of the first electrode 51. The first electrode 51 functions as, for example, a source electrode. The second electrode 52 functions as, for example, a drain electrode. The third electrode 53 functions as, for example, a gate electrode. The semiconductor device 110 is, for example, a transistor.

The fourth partial region 11d includes a region facing the first portion 13a. The fifth partial region 11e includes a region facing the second portion 13b. A carrier region 10c is formed in these regions. The carrier region 10c is, for example, a two-dimensional electron gas. The semiconductor device 110 is, for example, a HEMT (high electron mobility transistor).

As shown in FIG. 1, in one example of the embodiment, the second layer 12 does not include a region that overlaps the fourth partial region 11d in the second direction D2 and does not include a region that overlaps the fifth partial region 11e in the second direction D2. As will be described later, the second layer 12 may include other regions. In this case, a first thickness t1 along the second direction D2 of the first compound region 12a may be thinner than the thickness of the other regions.

By not including the region where the second layer 12 overlaps the fourth partial region 11d in the second direction D2 and not including the region overlapping the fifth partial region 11e in the second direction D2, the carrier region 10c is formed in the region of the fourth partial region 11d facing the first portion 13a and the region of the fifth partial region 11e facing the second portion 13b.

On the other hand, in a region overlapping the third electrode 53, the first compound region 12a of the second layer 12 is provided. The formation of the carrier region 10c is suppressed in the region of the first layer 11 that overlaps the first compound region 12a. As a result, for example, a high threshold voltage can be obtained. For example, a normally-off operation can be obtained. According to the embodiment, it is possible to provide a semiconductor device whose characteristics can be improved.

For example, there is a first reference example using a recess type gate electrode. There is a second reference example of performing impurity doping. Even in these reference examples, a high threshold voltage may be possible to be obtained. However, in these reference examples, a complicated process is used.

In the embodiment, for example, a recess type gate electrode is not required. No impurity doping is required. In the embodiment, a stable high threshold voltage can be obtained by a simple process.

In the embodiment, for example, the second layer 12 is locally provided. Thereby, polarization can be controlled appropriately. The carrier region 10c is locally provided. High carrier mobility is obtained and low on-resistance is obtained. For example, by providing the first layer 11 including SiC, high heat dissipation can be obtained. It is easy to obtain stable operating characteristics.

In the embodiment, the second layer 12 has polarity. The third layer 13 has polarity, for example.

For example, a lattice length in the third layer 13 in a crossing direction crossing the second direction D2 is shorter than a lattice length in the second layer 12 along the crossing direction. The crossing direction is, for example, along the X-Y plane. The crossing direction is, for example, the a-axis direction. For example, the a-axis lattice length in the third layer 13 is shorter than the a-axis lattice length in the second layer 12. The formation of the carrier region 10c is suppressed in the portion where the second layer 12 is provided.

In the embodiment, the composition ratio z in the third layer 13 is preferably 0.8 or more. As a result, the carrier region 10c is likely to be appropriately formed. The third layer 13 includes, for example, AlN. The carrier region 10c is properly formed.

In one example, the composition ratio x in the second layer 12 may be 0.1 or less. At this time, the composition ratio z is 0.8 or more (for example, AlN), the composition ratio y is not less than 0.01 and not more than 0.2, and a thickness t13c along the second direction D2 of the third portion 13c is not less than 3 nm and not more than 5 nm.

In one example, the composition ratio z is 0.8 or more (e.g., AlN), the composition ratio x is not less than 0.1 and not more than 0.5, and the thickness t13c of the third portion 13c along the second direction D2 is not less than 2 nm and not more than 4 nm.

For example, the first thickness t1 is thicker than the thickness t13c of the third portion 13c along the second direction D2. As a result, the carrier region 10c is intensively formed. A high threshold voltage is stably and easily obtained.

For example, the first thickness t1 is preferably 1.05 times or more the thickness t13c of the third portion 13c along the second direction D2. As a result, the carrier region 10c is stably and less likely to be generated locally. A high threshold voltage is stably and easily obtained. The first thickness t1 may be 1.5 times or more the thickness t13c. The first thickness t1 may be twice or more the thickness t13c.

As shown in FIG. 1, the insulating member 41 may further include a second insulating region 41b and a third insulating region 41c. The first portion 13a is located between the fourth partial region 11d and the second insulating region 41b. For example, the first portion 13a is in contact with the fourth partial region 11d and the second insulating region 41b. The second portion 13b is located between the fifth partial region 11e and the third insulating region 41c. The second portion 13b is in contact with the fifth partial region 11e and the third insulating region 41c.

A thickness t41 of the first insulating region 41a along the second direction D2 is preferably, for example, not less than 20 nm and not more than 100 nm. When the thickness t41 is 20 nm or more, for example, a continuous film shape can be stably obtained in the first insulating region 41a. When the thickness t41 is 100 nm or less, for example, practical characteristics can be easily obtained.

In the embodiment, the third layer 13 is in contact with the first layer 11. In this example, the first compound region 12a is in contact with the third layer 13.

Figure 2:
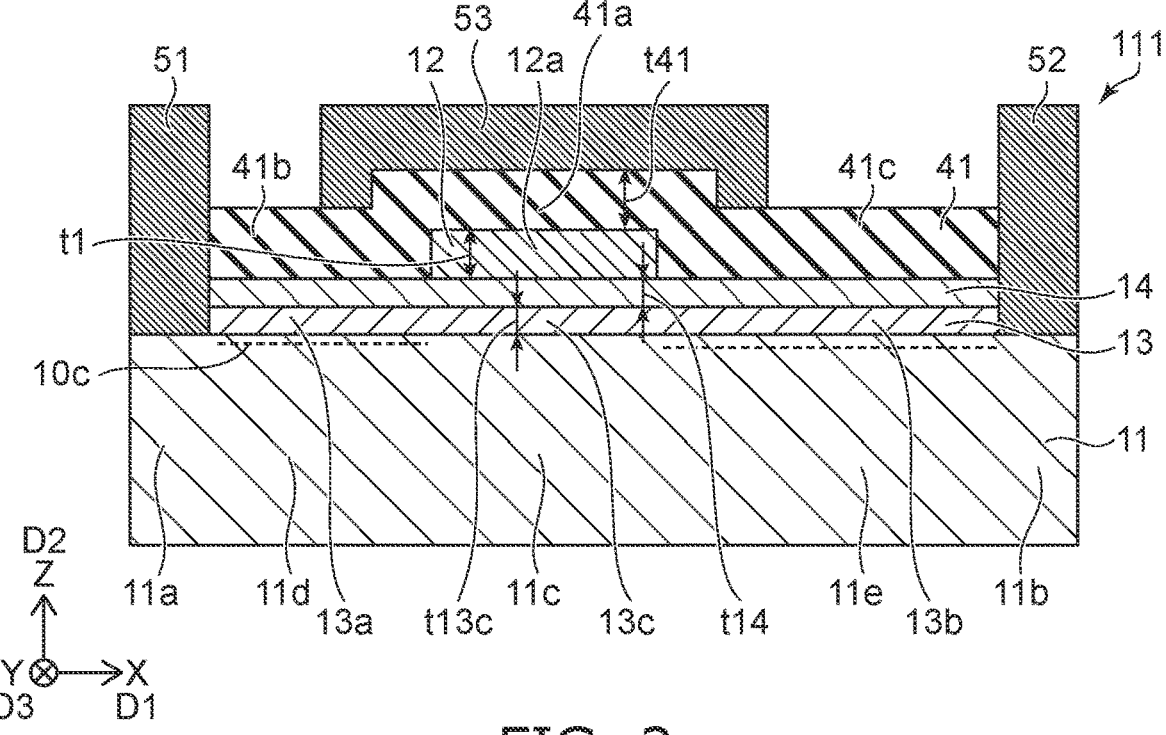
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 2, a semiconductor device 111 according to the embodiment includes a fourth layer 14. Except for this, the configuration of the semiconductor device 111 may be the same as the configuration of the semiconductor device 110.

At least a part of the fourth layer 14 is provided between the third layer 13 and the second layer 12. The fourth layer 14 includes, for example, $Al_\alpha Ga_{1-\alpha}N$ ($x<\alpha<z$). For example, the third layer 13 includes AlN, and the fourth layer 14 includes AlGaN. Also in such a semiconductor device 111, the polarization is appropriately controlled by providing the second layer 12. The carrier region 10c is locally provided. For example, a high threshold voltage can be obtained. For example, a normally-off operation can be obtained. It is possible to provide a semiconductor device whose characteristics can be improved. In the semiconductor device 111, the third layer 13 and the fourth layer 14 may be regarded as a region where the Al composition ratio changes.

Figure 3:
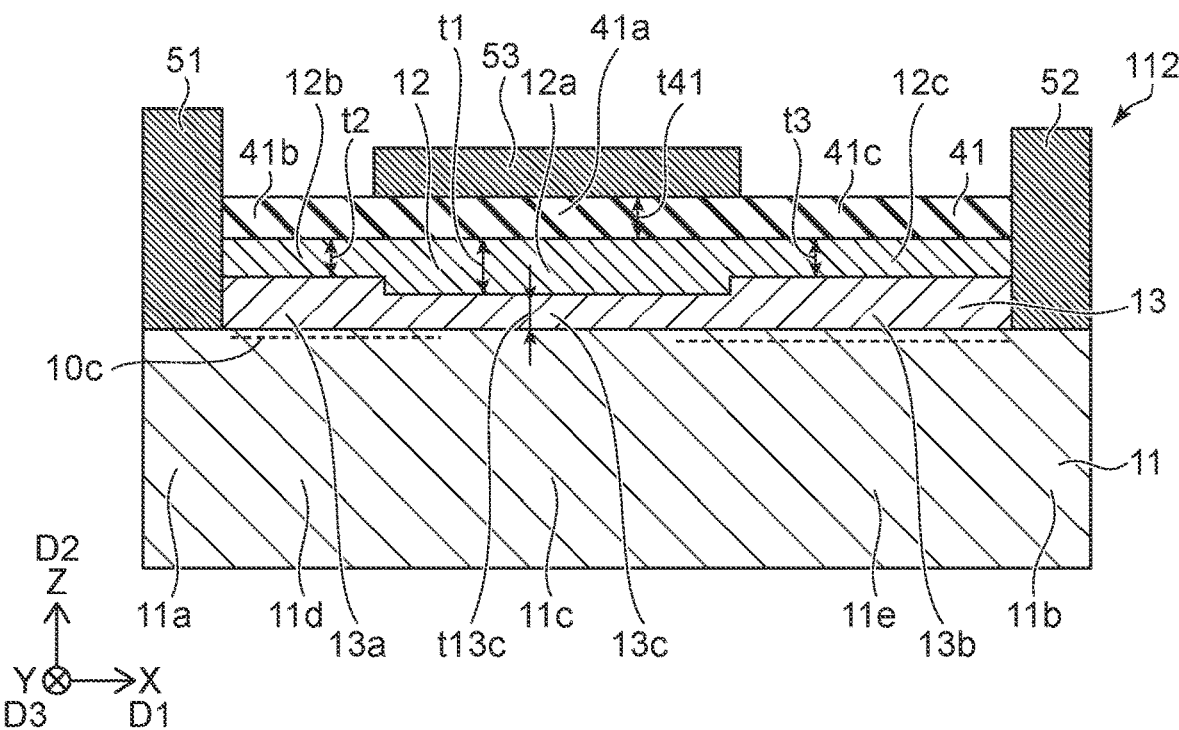
FIG. 3 is a schematic cross-sectional view illustrating the semiconductor device according to the first embodiment.

FIG. 3 is a schematic cross-sectional view illustrating the semiconductor device according to the first embodiment.

As shown in FIG. 3, in a semiconductor device 112 according to the embodiment, the second layer 12 includes a second compound region 12b and a third compound region 12c. Except for this, the configuration of the semiconductor device 112 may be the same as the configuration of the semiconductor device 110.

A direction from the fourth partial region 11d to the second compound region 12b and a direction from the fifth partial region 11e to the third compound region 12c are along the second direction D2. A thickness of the second compound region 12b along the second direction D2 is defined as a second thickness t2. A thickness of the third compound region 12c along the second direction D2 is defined as a third thickness t3. The first thickness t1 (thickness of the first compound region 12a along the second direction D2) is thicker than the second thickness t2 and thicker than the third thickness t3.

For example, in the first layer 11, the carrier region 10c is formed in the region overlapping the second compound region 12b in the second direction D2. In the first layer 11, the carrier region 10c is formed in the region overlapping the third compound region 12c in the second direction D2. On the other hand, in the region overlapping the first compound region 12a in the second direction D2, the formation of the carrier region is suppressed. Polarization is appropriately controlled. The carrier region 10c is locally provided. For example, a high threshold voltage can be obtained. For example, a normally-off operation can be obtained. It is possible to provide a semiconductor device whose characteristics can be improved.

In the semiconductor device 112, the first thickness t1 is preferably 1.05 times or more the second thickness t2, and preferably 1.05 times or more the third thickness t3. This allows the polarization to be controlled more appropriately. It is easy to obtain a high threshold voltage and high carrier mobility. For example, the first thickness t1 may be 1.5 times or more the second thickness t2, and may be 1.5 times or more the third thickness t3. In the embodiment, the first thickness t1 is twice or more the second thickness t2, and may be twice or more the third thickness t3. A high threshold voltage can be obtained more stably.

In the semiconductor device 112, the first compound region 12a is located between a part of the third layer 13 and another part of the third layer 13 in the first direction D1. For example, a recess is provided in the third layer 13, and a part of the second layer 12 is provided in the recess.

Figure 4:
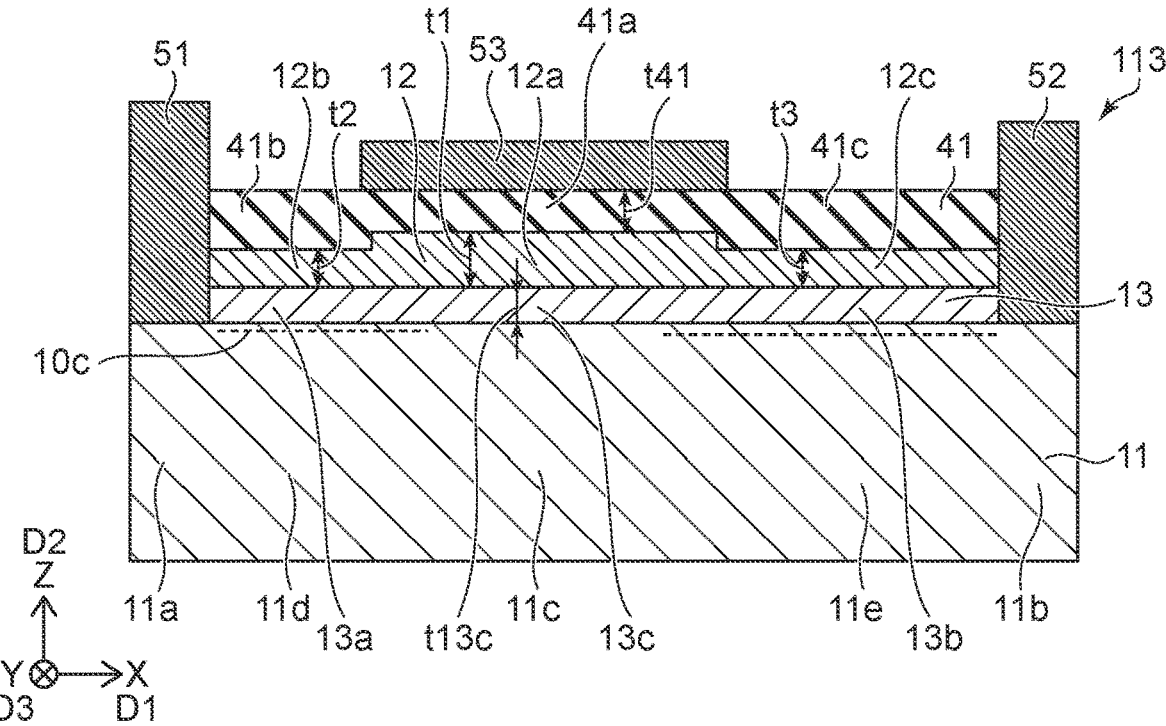
FIG. 4 is a schematic cross-sectional view illustrating the semiconductor device according to the first embodiment.

FIG. 4 is a schematic cross-sectional view illustrating the semiconductor device according to the first embodiment.

As shown in FIG. 4, also in a semiconductor device 113 according to the embodiment, the second layer 12 includes the second compound region 12b and the third compound region 12c. Except for this, the configuration of the semiconductor device 113 may be the same as the configuration of the semiconductor device 112.

Also in the semiconductor device 113, the first thickness t1 is thicker than the second thickness t2 and thicker than the third thickness t3. In the semiconductor device 113, the first compound region 12a is located between a part of the insulating member 41 and another part of the insulating member 41 in the first direction D1. In the semiconductor device 113 as well, the polarization is appropriately controlled. The carrier region 10c is locally provided. For example, a high threshold voltage can be obtained. For example, a normal off operation can be obtained. It is possible to provide a semiconductor device whose characteristics can be improved.

The fourth layer 14 may be provided in the semiconductor devices 112 and 113. Also, in the semiconductor devices 111 to 113, for example, high carrier mobility can be obtained and low on-resistance can be obtained. For example, high heat dissipation can be obtained. It is easy to obtain stable operating characteristics.

In the semiconductor devices 110 to 113, for example, the second layer 12 does not have to include impurities. For example, the second layer 12 does not include the first element, or the concentration of the first element in the second layer 12 may be less than $1 \times 10^{17}/cm^3$. The first element includes, for example, at least one selected from the group consisting of Mg, Zn and C.

In the semiconductor devices 110 to 113, for example, the third electrode 53 may include a region that does not overlap the first compound region 12a in the second direction D2.

In the semiconductor devices 110 to 113, the SiC included in the first layer 11 includes, for example, at least one selected from the group consisting of 4H-SiC and 6H-SiC. It is easy to obtain good characteristics.

In the above example, the second layer 12 includes $Al_xIn_yGa_{1-x-y}N$ ($x+y=1$, $0 \leq x \leq 1$, $0 \leq y \leq 1$).

In the embodiment (for example, a second embodiment), the second layer 12 may include other material. For example, the second layer 12 may include the first material. The first material may include at least one selected from the group consisting of zinc oxide, the first compound, and the second compound. The first compound includes Group II elements and Group VI elements. The second compound includes Group III and Group V elements. The second layer 12 has polarity. In this case as well, the second layer 12 includes the first compound region 12a (see FIGS. 1 to 4). The first compound region 12a is provided between the third partial region 11c and the third electrode 53. Also in this case, the third portion 13c of the third layer 13 is located between the third partial region 11c and the first compound region 12a. The lattice length in the third layer 13 in the crossing direction crossing the second direction D2 is shorter than the lattice length in the second layer 12 along the crossing direction. The crossing direction is, for example, along the a-axis direction.

Also in such a semiconductor device, the polarization is appropriately controlled. The carrier region 10c is locally provided. For example, a high threshold voltage can be obtained. For example, a normally-off operation can be obtained. It is possible to provide a semiconductor device whose characteristics can be improved.

In one example where the second layer 12 includes the first material described above, the second layer 12 includes zinc oxide and the third layer 13 includes AlN (or AlGaN). In the semiconductor devices 111 to 113, the second layer 12 may include the first material describes above. Normally-off operation can be performed. Even when the second layer 12 includes the first material described above, for example, high carrier mobility and low on-resistance can be obtained. For example, high heat dissipation can be obtained. It is easy to obtain stable operating characteristics. Even when the second layer 12 includes the first material described above, the SiC included in the first layer 11 includes, for example, at least one selected from the group consisting of 4H-SiC and 6H-SiC.

Hereinafter, an example of a method for manufacturing the semiconductor device according to the embodiment will be described.

FIGS. 5A to 5D and 6A to 6C are schematic cross-sectional views illustrating a method for manufacturing the semiconductor device according to an embodiment.

Figure 5A:
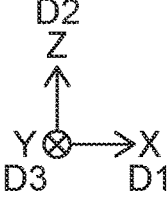
FIGS. 5A to 5D are schematic cross-sectional views illustrating a method for manufacturing a semiconductor device according to an embodiment.
Figure 5A:

As shown in FIG. 5A, the first layer 11 is prepared. The first layer 11 may be, for example, a SiC substrate.

Figure 5B:
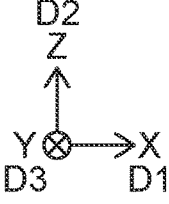
Figure 5B:
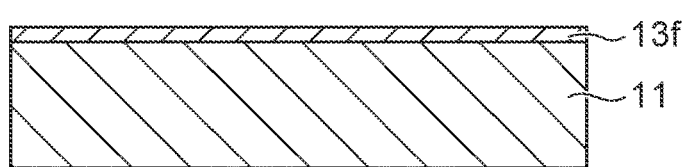
Figure 5C:
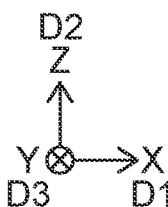
Figure 5C:
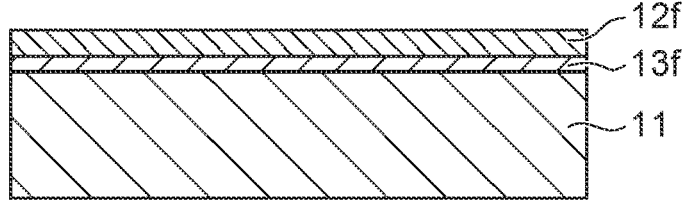

As shown in FIG. 5B, a third film 13f to be the third layer 13 is formed on the first layer 11. As shown in FIG. 5C, a second film 12f to be the second layer 12 is formed on the third film 13f.

These films can be formed, for example, by the MOCVD (Metal Organic Chemical Vapor Deposition) method.

Figure 5D:
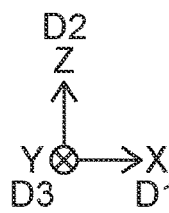
Figure 5D:
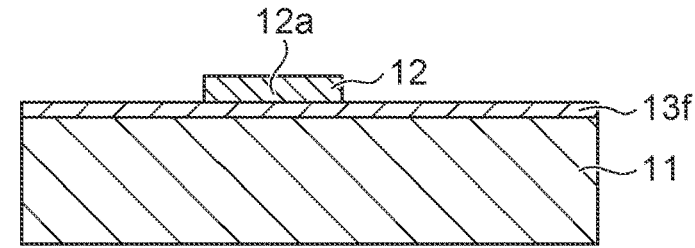

As shown in FIG. 5D, a part of the second film 12f is removed. As a result, the first compound region 12a of the second layer 12 is obtained. At this time, a thin portion (second compound region 12b and third compound region 12c) in the second layer 12 may be formed.

Figure 6A:
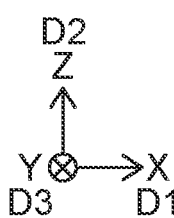
FIGS. 6A to 6C are schematic cross-sectional views illustrating the method for manufacturing a semiconductor device according to the embodiment.
Figure 6A:
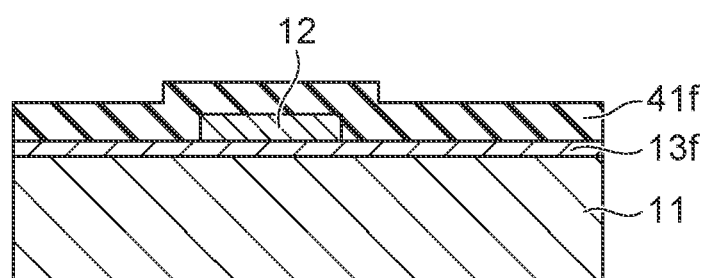

As shown in FIG. 6A, an insulating film 41f to be the insulating member 41 is formed on the third film 13f and the second layer 12. The insulating film 41f can be formed by, for example, CVD (Chemical Vapor Deposition).

Figure 6B:
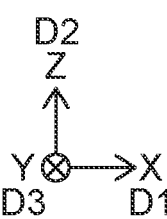
Figure 6B:
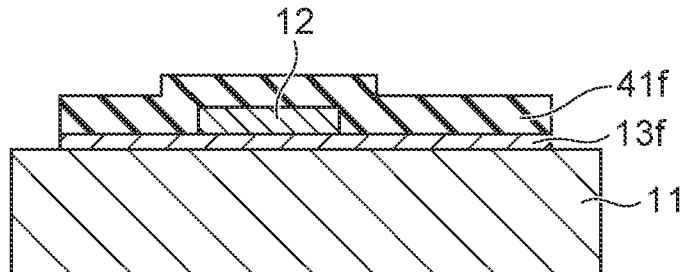

As shown in FIG. 6B, a part of the insulating film 41f and a part of the third film 13f are removed to expose a part of the first layer 11. The insulating member 41 is obtained from the insulating film 41f. The third layer 13 is obtained from the third film 13f.

Figure 6C:
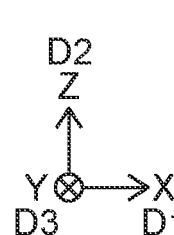
Figure 6C:
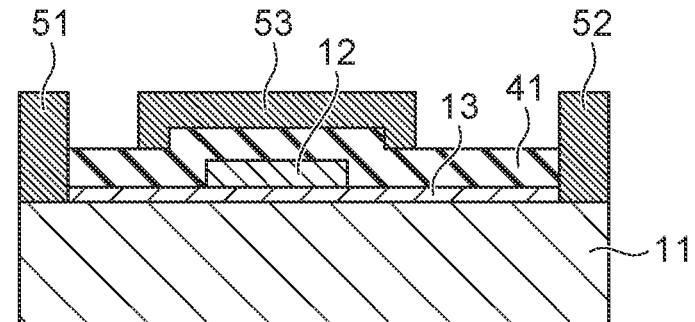

As shown in FIG. 6C, the first electrode 51, the second electrode 52, and the third electrode 53 are formed. As a result, the semiconductor device 110 is obtained.

In the embodiment, the first electrode 51 and the second electrode 52 include, for example, Al. The third electrode 53 includes, for example, at least one selected from the group consisting of TiN and Au. The insulating member 41 includes, for example, at least one selected from the group consisting of oxygen and nitrogen, and at least one selected from the group consisting of silicon and aluminum.

Information on shape, length, thickness, etc. can be obtained by, for example, electron microscope observation. Information on the composition of the material can be obtained by SIMS (Secondary Ion Mass Spectrometry) or EDX (Energy dispersive X-ray spectroscopy).

According to the embodiment, it is possible to provide a semiconductor device whose characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, layers and insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode;
a third electrode, a position of the third electrode in a first direction from the first electrode to the second electrode being between a position of the first electrode in the first direction and a position of the second electrode in the first direction;
a first layer including SiC, the first layer including a first partial region, a second partial region, a third partial region, a fourth partial region and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being located between the first partial region and the third partial region in the first direction, the fifth partial region being located between the third partial region and the second partial region in the first direction;
a second layer including $Al_xIn_yGa_{1-x-y}N$ ($x+y=1$, $0 \le x < 1$, $0 \le y \le 1$), the second layer including a first compound region provided between the third partial region and the third electrode;
a third layer including $Al_zGa_{1-z}N$ ($x < z \le 1$), the third layer including a first portion, a second portion, and a third portion, a direction from the fourth partial region to the first portion being along the second direction, a direction from the fifth partial region to the second portion being along the second direction, the third portion being located between the third partial region and the first compound region, the third layer contacting the first layer; and
an insulating member including a first insulating region, the first insulating region being located between the first compound region and the third electrode,
the second layer not including a region overlapping the fourth partial region in the second direction, and not including a region overlapping the fifth partial region in the second direction, or
the second layer including a second compound region and a third compound region, a direction from the fourth partial region to the second compound region and a direction from the fifth partial region to the third compound region being along the second direction, a first thickness of the first compound region along the second direction being thicker than a second thickness of the second compound region along the second direction, and thicker than a third thickness of the third compound region along the second direction,
wherein the first thickness is thicker than a thickness of the third portion along the second direction,
a value of z is 0.8 or more,
a value of x is not less than 0.01 and not more than 0.5, and
a thickness of the third portion along the second direction is not less than 2 nm and not more than 4 nm.

2. The device according to claim 1, wherein the third layer includes AlN.

3. The device according to claim 1, wherein a value of x is 0.1 or less.

4. The device according to claim 1, wherein the first thickness is 1.05 times or more a thickness of the third portion along the second direction.

5. The device according to claim 1, wherein a value of y is not less than 0.01 and not more than 0.2, and a thickness of the third portion along the second direction is not less than 3 nm.

6. The device according to claim 1, wherein
the insulating member further includes a second insulating region and a third insulating region,
the first portion is located between the fourth partial region and the second insulating region, and is in contact with the fourth partial region and the second insulating region, and
the second portion is located between the fifth partial region and the third insulating region, and is in contact with the fifth partial region and the third insulating region.

7. The device according to claim 1, wherein
a thickness of the first insulating region along the second direction is not less than 20 nm and not more than 100 nm.

8. The device according to claim 1, wherein
the second layer includes a second compound region and a third compound region, and
the first thickness is 1.05 times or more the second thickness, and is 1.05 times or more the third thickness.

9. The device according to claim 1, wherein
the second layer includes a second compound region and a third compound region, and
the first thickness is 1.5 times or more the second thickness, and is 1.5 times or more the third thickness.

10. The device according to claim 1, wherein
the second layer includes a second compound region and
a third compound region, and
the first compound region is located between a portion of
the third layer and an other portion of the third layer in
the first direction.
11. The device according to claim 1, wherein
the second layer includes a second compound region and
a third compound region, and
the first compound region is located between a part of the
insulating member and an other part of the insulating
member in the first direction.
12. The device according to claim 1, wherein
the second layer does not include a first element, or a
concentration of the first element in the second layer is
less than $1\times10^{17}$ cm$^3$, and
the first element includes at least one selected from the
group consisting of Mg, Zn and C.
13. The device according to claim 1, wherein the third
electrode includes a region not overlapping the first com-
pound region in the second direction.
14. The device according to claim 1, wherein the device
is configured to operate in a normally-off mode.
15. A semiconductor device, comprising:
a first electrode;
a second electrode;
a third electrode, a position of the third electrode in a first
direction from the first electrode to the second electrode
being between a position of the first electrode in the
first direction and a position of the second electrode in
the first direction;
a first layer including SiC, the first layer including a first
partial region, a second partial region, a third partial
region, a fourth partial region and a fifth partial region,
a direction from the first partial region to the first
electrode being along a second direction crossing the
first direction, a direction from the second partial
region to the second electrode being along the second
direction, a direction from the third partial region to the
third electrode being along the second direction, the
fourth partial region being located between the first partial region and the third partial region in the first
direction, the fifth partial region being located between
the third partial region and the second partial region in
the first direction;
a second layer including Al$_x$In$_y$Ga$_{1-x-y}$N (x+y=1, 0≤x<1,
0≤y≤1), the second layer including a first compound
region provided between the third partial region and the
third electrode;
a third layer including Al$_z$Ga$_{1-z}$N (x<z≤1), the third layer
including a first portion, a second portion, and a third
portion, a direction from the fourth partial region to the
first portion being along the second direction, a direc-
tion from the fifth partial region to the second portion
being along the second direction, the third portion
being located between the third partial region and the
first compound region; and
an insulating member including a first insulating region,
the first insulating region being located between the
first compound region and the third electrode,
the second layer not including a region overlapping the
fourth partial region in the second direction, and not
including a region overlapping the fifth partial region in
the second direction, or
the second layer including a second compound region and
a third compound region, a direction from the fourth
partial region to the second compound region and a
direction from the fifth partial region to the third
compound region being along the second direction, a
first thickness of the first compound region along the
second direction being thicker than a second thickness
of the second compound region along the second
direction, and thicker than a third thickness of the third
compound region along the second direction,
wherein the first thickness is thicker than a thickness of
the third portion along the second direction,
a value of z is 0.8 or more,
a value of x is not less than 0.01 and not more than 0.5,
and
a thickness of the third portion along the second direction
is not less than 2 nm and not more than 4 nm.

* * * * *